United States Patent
Barth, Jr. et al.

(10) Patent No.: US 7,954,028 B2
(45) Date of Patent: *May 31, 2011

(54) STRUCTURE FOR REDUNDANCY PROGRAMMING OF A MEMORY DEVICE

(75) Inventors: John Edward Barth, Jr., Williston, VT (US); Kevin William Gorman, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 557 days.

This patent is subject to a terminal disclaimer.

(21) Appl. No.: 12/046,508

(22) Filed: Mar. 12, 2008

(65) Prior Publication Data

US 2008/0170448 A1    Jul. 17, 2008

Related U.S. Application Data

(63) Continuation-in-part of application No. 11/612,628, filed on Dec. 19, 2006, now Pat. No. 7,549,098.

(51) Int. Cl.
G01R 31/28    (2006.01)
(52) U.S. Cl. .................. 714/733; 714/734; 714/736
(58) Field of Classification Search .................. 714/733, 714/734, 718, 736, 710, 711, 30; 716/4
See application file for complete search history.

(56) References Cited

U.S. PATENT DOCUMENTS

| | | |
|---|---|---|
| 5,805,789 A | 9/1998 | Huott et al. |
| 5,859,804 A | 1/1999 | Hedberg et al. |
| 5,920,515 A | 7/1999 | Shaik et al. |
| 5,961,653 A * | 10/1999 | Kalter et al. ............ 714/7 |
| 6,178,126 B1 | 1/2001 | Kirihata et al. |
| 6,505,317 B1 | 1/2003 | Smith et al. |
| 6,574,757 B1 | 6/2003 | Park et al. |
| 6,643,807 B1 * | 11/2003 | Heaslip et al. ............ 714/719 |
| 6,934,900 B1 | 8/2005 | Cheng et al. |
| 7,050,343 B2 | 5/2006 | Kumar et al. |
| 7,064,990 B1 | 6/2006 | Dawson et al. |
| 7,089,474 B2 | 8/2006 | Burdine et al. |
| 2002/0157051 A1 | 10/2002 | Eckelman et al. |
| 2008/0126901 A1 | 5/2008 | Cheng et al. |

OTHER PUBLICATIONS

Notice of Allowance (Mail Date Feb. 20, 2009) for U.S. Appl. No. 11/612,628, filed Dec. 19, 2006; Confirmation No. 6449.
Office Action (Mail Date Nov. 13, 2008) for U.S. Appl. No. 11/612,628, Filing Date Dec. 19, 2006; Examiner Chung, Phung M.; Confirmantion No, 6449.

* cited by examiner

*Primary Examiner* — Phung M Chung
(74) *Attorney, Agent, or Firm* — Schmeiser, Olsen & Watts; Michael J. LeStrange

(57) ABSTRACT

A design structure for implementing redundancy programming in a memory macro of an integrated circuit chip. It is assumed that all fails are row fails until determined to be bitline fails, circuits for implementing a method wherein it is assumed that all fails are row fails until determined to be bitline fails and test patterns are passed back to the failure detecting circuit when a wordline destination of the test patterns has previously been determined to be failing, and the test patterns and resultant patterns are passed between the memory macro and a test engine via logic paths connecting the memory macro to other circuits in said integrated circuit chip.

9 Claims, 3 Drawing Sheets

US 7,954,028 B2

STRUCTURE FOR REDUNDANCY PROGRAMMING OF A MEMORY DEVICE

The present application is a Continuation In Part of U.S. patent application Ser. No. 11/612,628 filed on Dec. 19, 2006, now U.S. Pat. No. 7,549,098.

FIELD OF THE INVENTION

The present invention relates to a method, an apparatus and a design structure for testing and redundancy allocation for defective array rows and columns of one or more memory arrays of an integrated circuit.

BACKGROUND OF THE INVENTION

The need for increasing performance is driving the use of smaller and local memory macros that are embedded in the various circuit functions of custom integrated circuits. However there is a large amount of support circuitry associated with each memory macro in order to test the memory macros. The support circuits consume significant silicon area thus increasing the cost of the integrated circuits. Therefore, there is a need to reduce the area impact of test circuits of embedded memory macros without significant reduction in test coverage or increase in test time.

SUMMARY OF THE INVENTION

A first aspect of the present invention is a design structure embodied in a machine readable medium for designing, manufacturing, or testing an integrated circuit, the design structure comprising: an integrated circuit chip having one or more memory macros and an automatic built-in self-test circuit; means for sending a test pattern to the memory macro from the automatic built-in self-test circuit; means for sending an expected test pattern based on the test pattern to a fail register and writing the test pattern into a memory array of a memory macro of the one or more memory macros; means for, in a standard mode, reading out a resultant pattern from the memory array and sending the resultant pattern from the memory array to the fail register, the fail register comparing the resultant pattern with the expected pattern and generating a current fail record based on the comparison in the fail register if the resultant pattern does not match the expected pattern, the current fail record comprising a type of fail field, a wordline address field and a data field as wide as the number of columns in the memory array and indicating which bits of the test pattern failed; means for storing the current fail record in the fail register if another fail record in the fail register does not have a same wordline address as the current fail record and writing the type of fail field of the current fail record as a wordline fail; means for, if all bits in the data field of the current fail record match all bits of a data field of any other fail record in the fail register and the number of failing bits is less than a preset number of bits but at least equal to one, changing the type of fail field of the current fail record to a bitline fail; means for sending a fail record from the fail register to a repair register of the memory macro; means for generating and storing in the repair register a wordline repair record based on the fail record and sending a wordline repair command to the memory array if the fail type field of the fail record indicates wordline fail, or generating and storing a bitline repair record and sending a bitline repair command to the memory array if the fail type field indicates a bitline fail, the bitline repair record based on the data field of the fail record; and means for replacing defective wordlines and bitlines of the memory array of the memory macro of the one or more memory macros with redundant wordlines and bitlines of the memory array based on the wordline and bitline repair commands.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
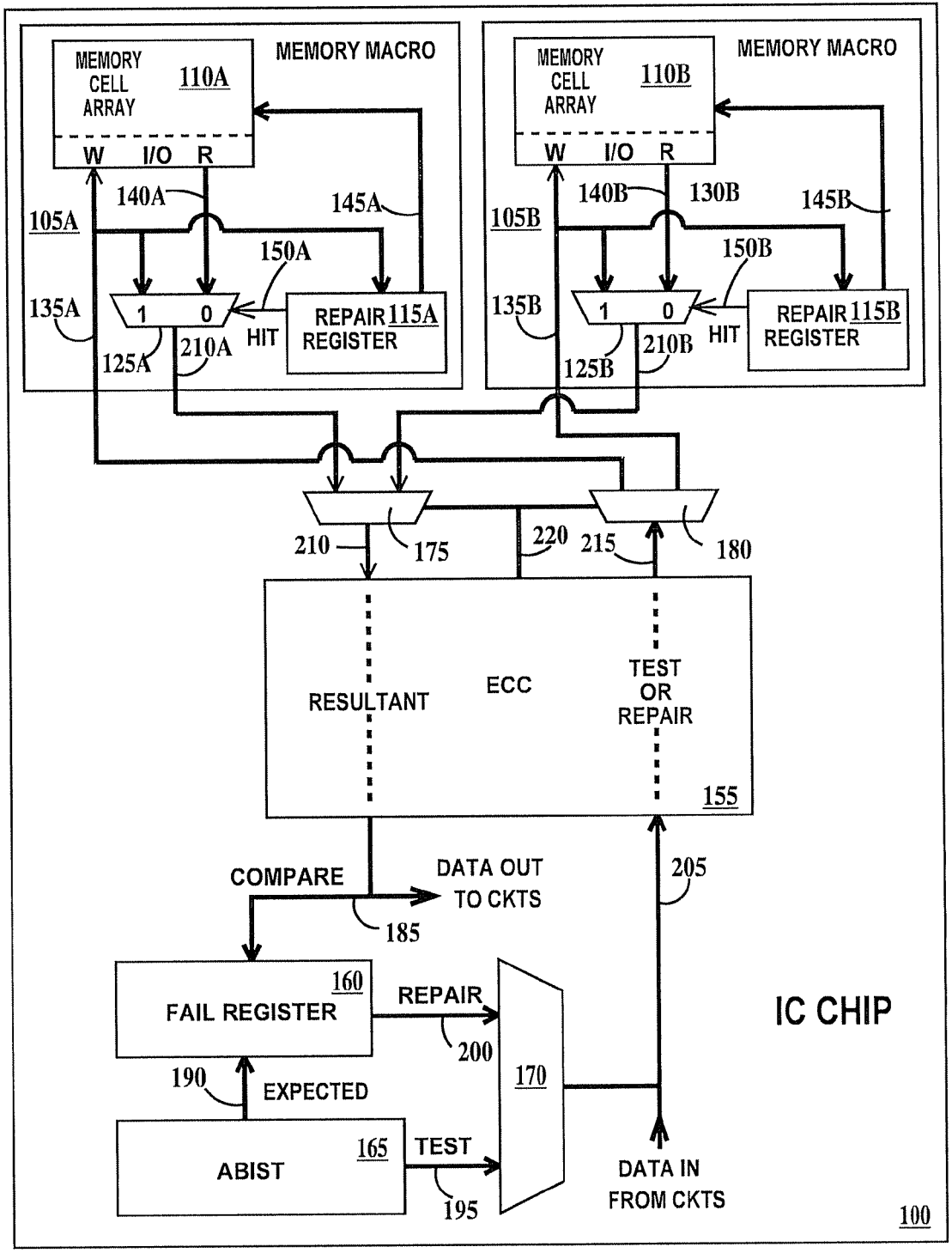
FIG. 1 is a schematic circuit diagram of an integrated circuit chip according to embodiments of the present invention.

FIG. 1 is a schematic circuit diagram of an integrated circuit chip according to embodiments of the present invention. In FIG. 1, an integrated circuit chip 100 includes two exemplary memory macros 105A and 105B. Memory macro 105A includes a memory cell array 110A comprising memory cells arranged in rows and columns, a repair register 115A (which includes support and logic circuits) and a MUX 125A. The rows and columns of memory cell array 110A include normal rows and columns and spare (or redundant) rows and columns. Generally rows are addressable as wordlines and columns as bitlines. A write bus 135A is connected to the I/O circuits of memory cell array 110A, to repair register 115A and to a first data input of MUX 125A. The I/O circuits of memory cell array 110A and a second data input of MUX 125A are connected by a read bus 140A. Write bus carries both wordline and bitline addresses and column or bitline data, however only the column data is delivered to MUX 125A (the branch of bus 135A connected to MUX 125A is a sub-bus). Read bus 140A carries only column or bitline data. Repair register 115A is connected to memory cell array 110A by a bus 145A to allow repair commands generated in the repair register to be transferred and implemented in memory cell array 110A. Repair register 115A is connected to the switch input of MUX 125A and can send a "HIT" signal 150A which switches the output of MUX 125A from read bus 140A to write bus 135A. This effectively redirects data on write bus 135A back to the test circuits as described infra.

Integrated circuit 100 also includes an optional second memory macro 105B, which is similar to memory macro 105A. However, memory cell array 110B may be the same array size (number of memory cells) or a different array size from memory cell array 110A. Memory cell array 110B may be the same array shape (number of rows and columns) or a different array shape as memory cell array 110A. Memory cell array 110B may be of the same type of memory or a different type of memory as memory cell array 110A. Examples of types of memory include but are not limited to static random access memory (SRAM) and dynamic random access memory (DRAM).

Integrated circuit chip 100 may include an optional error correction circuit (ECC) 155. When ECC 155 is included, the ECC unit includes a pass through function that is invoked in both operating modes (discussed infra) of the invention. Integrated circuit chip 100 also includes a fail register 160, an automatic built-in self-test (ABIST) macro 165, a test/repair MUX 170, a read MUX 175 and a write MUX 180. ECC 155 is connected to fail register 160 via a bus 185. ABIST 165 is connected to fail register 160 by a bus 190 and to a first data input of MUX 170 by a bus 195. Fail register 160 is connected to a second data input of MUX 170 by a bus 200. The data output of MUX 170 is connected to ECC 155 by a bus 205. Buses 185 and 205 are buses in the logic path connecting the memory macros to other circuits in integrated circuit 100 as opposed to being dedicated test buses. However test buses may be used. Buses 135A and 135B are connected to respective data outputs of MUX 180 and buses 210A and 210B connect respective data outputs of MUXes 125A and 125B to data inputs of MUX 175. The data output of MUX 175 is connected to ECC 155 by a bus 210 and the data input of MUX 180 is connected to ECC 155 by a bus 215. The switch inputs of MUXes 175 and 180 are connected to ECC 155 by a bus 220. The pass through function of ECC 155 passes records/data on bus 205 to bus 215 unaltered and passes records/data on bus 210 to bus 185 unaltered.

While two memory macros are illustrated in FIG. 1, there may be one or more memory macros and for each additional memory macro MUX 175 requires another data input and MUX 180 another data output.

Test data is a pattern of bits that is written to the columns (bitlines) of memory arrays during test and resultant data is a pattern of bits read out of columns (bitlines) of the memory arrays after a period of test time. An expected pattern is a pattern that will be read out of a memory array after writing a test pattern if the memory is working correctly. A repair record includes a memory macro ID field (if there are more than one memory macros), a type of fail field (wordline or bitline), a wordline address field and a data field as wide as the number of columns (bitlines, not counting redundant bitlines) in the memory array of the memory macro and indicating which bits failed. The data field indicates which bits are failing. This record organization allows all fails to first be assumed to be wordline fails and then later changed to bitline fails if necessary after a comparison of the data fields of subsequent fail of other wordlines. Details of this process are described in U.S. Pat. No. 5,859,804 issued to Hedberg et al. on Jan. 12, 1999 and hereby incorporated by reference.

ABIST 165 generates a test pattern of bits that is sent to MUX 170 and presented to ECC 155. ABIST also sends an expected pattern of bits to fail register 160. ECC 155 sends a resultant pattern of bits to fail register 160. Fail register 160 generates fail record that is sent to MUX 170 and presented to ECC 155. Fail register generates the fail record by comparing resultant patterns to expected patterns. Details of this process are described in U.S. Pat. No. 5,805,789 issued to Huott et al. on Sep. 8, 1998 and hereby incorporated by reference. In one example, the number of records that can be stored in fail register 160 is half or less than the number of records that can be stored in repair register 115A or repair register 115B. Therefore an enhanced mode is provided, which is useful when the fail register 160 is significantly smaller than the repair registers 115A and 115B and the fail register must be cycled two or more times to complete testing of a memory cell array. In enhanced mode repair registers 115A and 115B are enabled to compare the destination wordline address of each test pattern sent to the repair register with the wordline addresses of fail records having a type of fail field=wordline previously stored in the repair register. If a wordline is already marked for replacement repair registers 115A and 115B send a hit signal to respective MUXes 125A and 125B to redirect the entire test pattern to MUX 175. In enhanced mode, the expected pattern must be the same as the test pattern. Since comparing a test pattern with itself will result in a passing test, fail register 160 will not generate another (redundant) repair record. In a similar fashion repair registers 115A and 115B are enabled to, in the absence of a wordline hit and the presence of the fail field=bitline, allow any bitline repairs to generate a hit signal to respective MUXes 125A and 125B in order to redirect the portion of the test pattern corresponding to the marked bitlines to MUX 175. Since comparing a test pattern with itself will result in a passing test, fail register 160 will not generate another (redundant) repair record. Enhanced mode can be disabled or the circuits physically not present (in some or all of the memory macros) in an alternative embodiment of the present invention. For example, if the memory macro is small, then the repair register may be smaller than the fail register.

Figure 2:
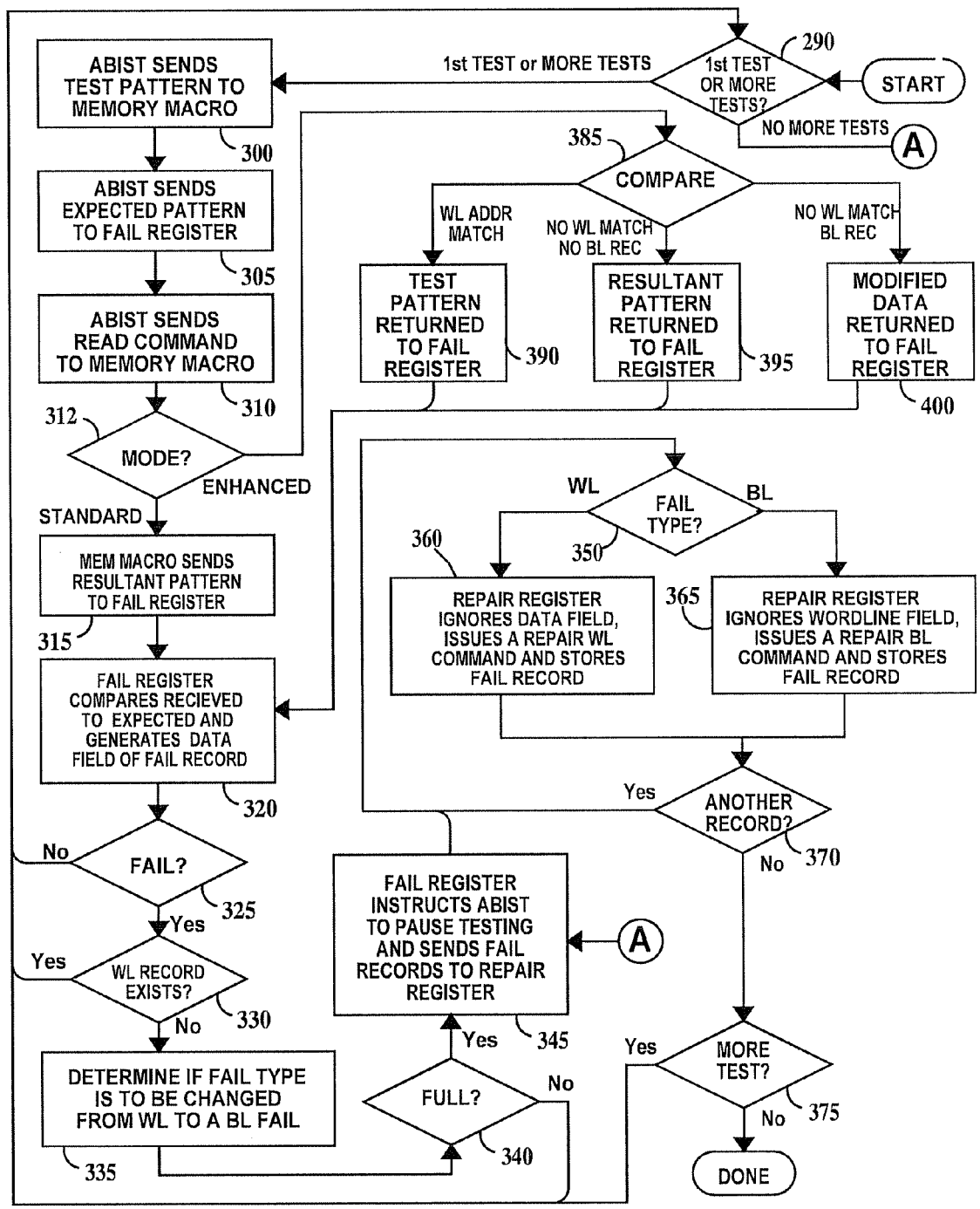
FIG. 2 is a flow diagram of the operation of the circuit of FIG. 1.

FIG. 2 is a flow diagram of the operation of the circuit of FIG. 1. The method starts in step 290. In step 290, if the testing is initializing then the method proceeds directly to step 300 otherwise it is determined if further testing is to be performed. If further testing is to be performed then the method proceeds to step 300, otherwise the method proceeds to step 345 (via connector "A"). In step 300, ABIST sends a test pattern to a selected wordline of the memory macro. In step 305, ABIST sends an expected pattern to the fail register (in enhanced mode the expected pattern must be the same as the test pattern). In step 310, ABIST sends a read command to the memory macro. In step 312, which mode the test is being performed in is determined. If the test is in standard mode the method proceeds to step 315, otherwise to step 385. In step 315, the memory macro sends a resultant pattern to the fail register. In step 320, the fail register compares the received and expected patterns and generates a data field of current fail record. In step 325, if a fail is detected (resultant and expected patterns don't match), the method proceeds to step 330 (unless all patterns have been used and testing is complete, in which case testing of the memory macro is complete) otherwise it loops back to step 300 for another test pattern.

In step 330, it is determined if another fail record for the selected wordline already exists in the fail register. If another fail record for the current wordline does not exist the method proceeds to step 335 otherwise it loops back to step 300 for another test pattern (unless all patterns have been used and testing is complete, in which case testing of the memory macro is complete). In step 335, it is determined if the fail type should be changed from wordline to bitline. If the data field of the current fail record matches the data field of any other fail record in the fail register and the number of failing bits in the current fail record is less than a preset number of bits but at least equal to one, then the fail type field is changed from a wordline fail to a bitline fail and the fail record entered in the fail register. The present number of bits may range from 2 to the number of redundant bitlines available in the memory cell array. Generally, the present number will be small. In one example the present number is 1, 2 or 3. In one example, the present number is equal to about 10% of the number of redundant bitlines available. The method then proceeds to step 340.

In step 340 it is determined if the fail register is full. If the fail register is not full and an existing wordline fail was not changed to a bitline fail then a wordline fail record is created and the method loops back to step 300. If the fail register is full the method proceeds to step 345. In step 345 the fail register instructs ABIST to pause testing and send the fail records to the repair register and the method proceeds to step 350.

In step 350, the first/next fail record is received from the fail register and it is determined if the first (or next) fail record fail type field indicates a wordline or a bitline fail. If a wordline fail is indicated the method proceeds to step 360 otherwise to step 365. In step 360 the repair register ignores the data field of the record, stores the fail record and issues a repair wordline command to the repair register. The method then proceeds to step 370. In step 370 it is determined if another fail record is to be received from the fail register. If so, then the method loops back to step 350, otherwise the method proceeds to step 375.

In step 365 the repair register ignores the wordline field of the record, stores repair record and issues a repair bitline command to the redundancy register. The method then proceeds to step 370. In step 370 it is determined if another fail record is to be received from the fail register. If so, then the method loops back to step 350, otherwise the method proceeds to step 375.

In step 375, it is determined if more testing of the memory macro is to be performed. If so, then the method loops back to step 300, otherwise the method terminates or proceeds to testing another memory macro.

Steps 385 through 400 are performed only in enhanced mode. In step 385, up to three comparisons between the current fail record from fail register 160 (see FIG. 1) and the repair records of repair register 115A/115B are performed against three different sets of criteria in the following sequence. First, if the wordline address of the current test pattern matches any wordline address of any wordline repair record in said repair register then in step 390 the current test pattern to is returned to fail register 160 in step 320. In enhanced mode, the expected pattern and said current test pattern are the same pattern. Second, if the wordline address of the current test pattern does not match any wordline address of any wordline repair record in repair register 115A/115B and if a bitline repair record exists in the repair register then in step 395, a modified resultant pattern is generated in repair register 115A/115B and returned to fail register 160 in step 320. The modified resultant pattern is generated by replacing the values of bits in positions of the resultant pattern corresponding to failing bit positions marked in the bitline repair record with the value of bits in the corresponding bit positions of the current test pattern. Third, if the wordline address of the current test pattern does not match any wordline address of any wordline repair record in repair register 115A/115B and if no bitline repair record exists in the repair register then in step 400, the resultant test pattern is returned to fail register 160 in step 320.

Steps 300 through 400 will repeat for each memory macro to be tested.

Figure 3:
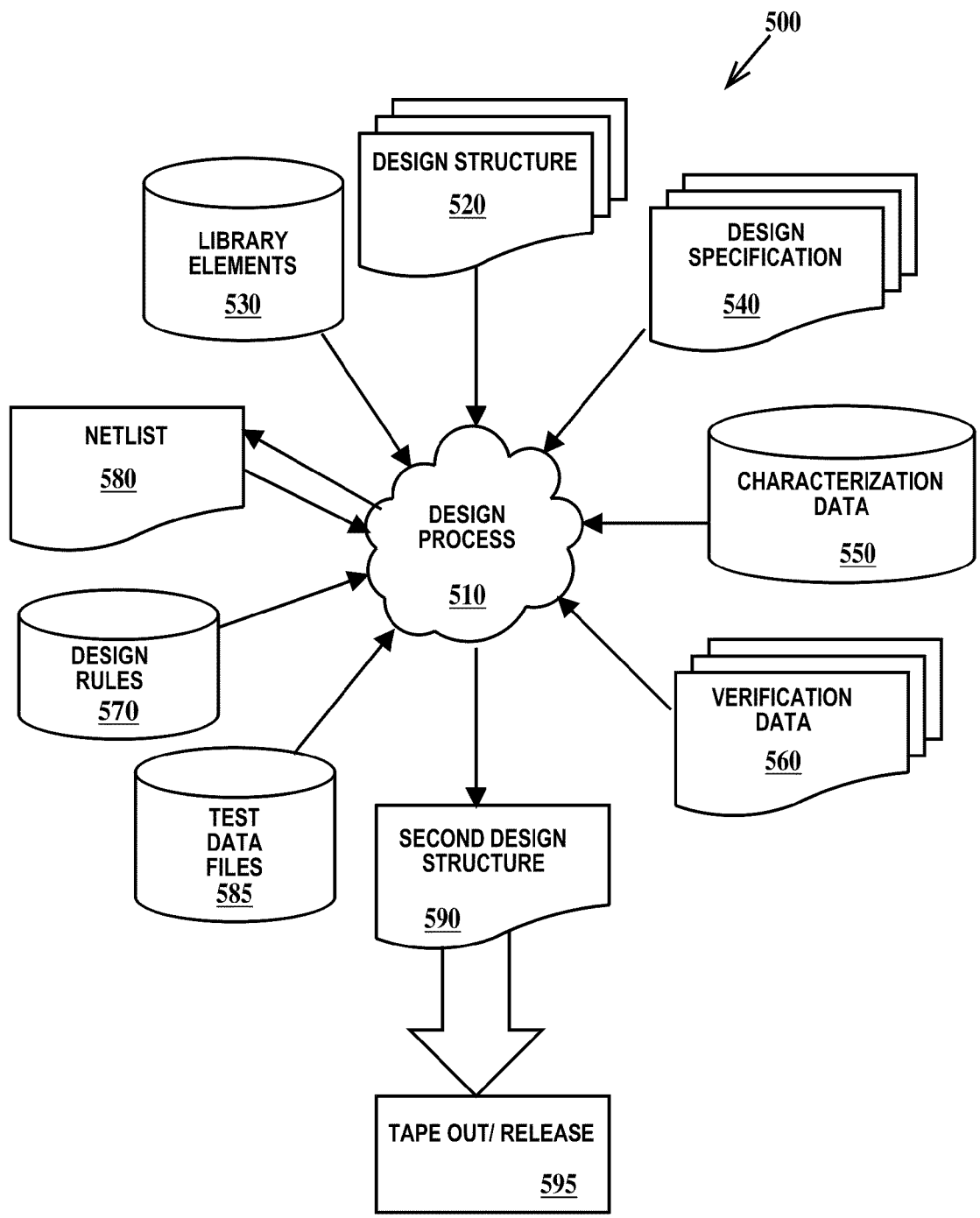
FIG. 3 shows a block diagram of an exemplary design flow 500 used for example, in semiconductor design, manufacturing, and/or test.

FIG. 3 shows a block diagram of an exemplary design flow 500 used for example, in semiconductor design, manufacturing, and/or test. Design flow 500 may vary depending on the type of IC being designed. For example, a design flow 500 for building an application specific IC (ASIC) may differ from a design flow 500 for designing a standard component. Design structure 520 is preferably an input to a design process 510 and may come from an IP provider, a core developer, or other design company or may be generated by the operator of the design flow, or from other sources. Design structure 520 comprises an embodiment of the invention as shown in FIG. 1 in the form of schematics or HDL, a hardware-description language (e.g., Verilog, VHDL, C, etc.). Design structure 520 may be contained on one or more machine readable medium. For example, design structure 520 may be a text file or a graphical representation of an embodiment of the invention as shown in FIG. 1. Design process 510 preferably synthesizes (or translates) an embodiment of the invention as shown in FIG. 1 into a netlist 580, where netlist 580 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 580 is resynthesized one or more times depending on design specifications and parameters for the circuit.

Design process 510 may include using a variety of inputs; for example, inputs from library elements 530 which may house a set of commonly used elements, circuits, and devices, including models, layouts, and symbolic representations, for a given manufacturing technology (e.g., different technology nodes, 32 nm, 45 nm, 50 nm, etc.), design specifications 540, characterization data 550, verification data 560, design rules 570, and test data files 585 (which may include test patterns and other testing information). Design process 510 may further include, for example, standard circuit design processes such as timing analysis, verification, design rule checking, place and route operations, etc. One of ordinary skill in the art of integrated circuit design can appreciate the extent of possible electronic design automation tools and applications used in design process 510 without deviating from the scope and spirit of the invention. The design structure of the invention is not limited to any specific design flow.

Design process 510 preferably translates an embodiment of the invention as shown in FIG. 1, along with any additional integrated circuit design or data (if applicable), into a second design structure 590. Design structure 590 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 590 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 590 may then proceed to a stage 595 where, for example, design structure 590: proceeds to tape-out, is released to manufacturing, is released to a mask house, is sent to another design house, is sent back to the customer, etc.

Thus, the embodiments of the present invention provide a method, an apparatus and design structure to reduce the area impact of test circuits of embedded memory macros without significant reduction in test coverage or increase in test time.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A design structure embodied in a non-transitory machine readable medium for designing, manufacturing, or testing an integrated circuit, the design structure comprising:
   an integrated circuit chip having one or more memory macros and an automatic built-in self-test circuit;
   means for sending a test pattern to said one or more memory macros from said automatic built-in self-test circuit;

means for sending an expected test pattern based on said
test pattern to a fail register and writing said test pattern
into a memory array of a memory macro of said one or
more memory macros;

means for, in a standard mode, reading out a resultant
pattern from said memory array and sending said resultant pattern from said memory array to said fail register,
said fail register comparing said resultant pattern with
said expected pattern and generating a current fail record
based on said comparison in said fail register if said
resultant pattern does not match said expected pattern,
said current fail record comprising a type of fail field, a
wordline address field and a data field as wide as the
number of columns in said memory array and indicating
which bits of said test pattern failed;

means for storing said current fail record in said fail register if another fail record in said fail register does not have
a same wordline address as said current fail record and
writing said type of fail field of said current fail record as
a wordline fail;

means for, if all bits in said data field of said current fail
record match all bits of a data field of any other fail
record in said fail register and the number of failing bits
is less than a preset number of bits but at least equal to
one, changing said type of fail field of said current fail
record to a bitline fail;

means for sending a fail record from said fail register to a
repair register of said memory macro;

means for generating and storing in said repair register a
wordline repair record based on said fail record and
sending a wordline repair command to said memory
array if said fail type field of said fail record indicates
wordline fail, or generating and storing a bitline repair
record and sending a bitline repair command to said
memory array if said fail type field indicates a bitline
fail, said bitline repair record based on said data field of
said fail record;

means for replacing defective wordlines and bitlines of
said memory array of said memory macro of said one or
more memory macros with redundant wordlines and
bitlines of said memory array based on said wordline and
bitline repair commands; and wherein the design structure comprises a netlist.

2. The design structure of claim 1, further including:
means for sending said test pattern to said repair register;
means for, comparing a current test pattern wordline
address to all fail records in said repair register;
means for, if a wordline address of said current test pattern
matches any wordline address of any wordline repair
record in said repair register, returning said current test
pattern to said fail register, said expected pattern and
said current test pattern being the same pattern; and
means for, if said wordline address of said current test
pattern does not match any wordline address of any
wordline repair record in said repair register and if said
bitline repair exists in said repair register, returning a
modified resultant pattern said fail register, said modified resultant pattern generated by replacing the values
of bits in positions of said resultant pattern corresponding to bit positions marked as failing in said bitline repair
record with the value of bits in said corresponding bit
positions of said current test pattern.

3. The design structure of claim 1, wherein each memory
array of each memory macro of said one or more memory
macros is independently selected from the group consisting
of dynamic access memory arrays and static access memory
arrays.

4. The design structure of claim 1, wherein a maximum
number of records that may be stored in said fail register is
less than a maximum number of records that may be stored in
said repair register.

5. The design structure of claim 1, wherein all fail records
include a memory macro ID field.

6. The design structure of claim 1, further including, buses
in the logic path connecting said one or more memory macros
to other circuits in said integrated circuit chip.

7. The design structure of claim 1, wherein said preset
number is 2 or 3.

8. The design structure of claim 1, wherein said preset
number is equal to about 10% of a number of redundant
bitlines in said memory array.

9. The design structure of claim 1, wherein the design
structure resides on storage medium as a data format used for
the exchange of layout data of integrated circuits.

* * * * *